United States Patent [19]

Lin et al.

[11] Patent Number: 5,068,878
[45] Date of Patent: Nov. 26, 1991

[54] METHOD AND APPARATUS FOR DATA INTERLEAVE WITH PSEUDO-RANDOMIZED RESYNCHRONIZATION

[75] Inventors: Shaw-Yueh Lin, Carlsbad; Russell D. Shon, San Diego, both of Calif.

[73] Assignee: Eastman Kodak Company, Rochester, N.Y.

[21] Appl. No.: 475,554

[22] Filed: Feb. 6, 1990

[51] Int. Cl.⁵ .................. H04L 7/06; H04N 5/78; G11B 5/09
[52] U.S. Cl. .................. 375/111; 360/38.1; 360/48
[58] Field of Search .......... 360/48, 38.1, 51, ; 375/111, 114, 115; 370/105

[56] References Cited

U.S. PATENT DOCUMENTS

| | | | |
|---|---|---|---|
| 3,641,534 | 2/1972 | Irwin | 340/174.1 |
| 3,702,996 | 11/1972 | Wolfer et al. | 340/174.1 H |
| 3,916,440 | 10/1975 | Irwin | 360/50 |
| 4,081,844 | 3/1978 | Devore et al. | 360/48 |
| 4,467,373 | 8/1984 | Taylor et al. | 360/38.1 |
| 4,665,447 | 5/1987 | Odaka | 360/77 |
| 4,680,651 | 7/1987 | Blessinger | 360/38.1 |
| 4,751,590 | 6/1988 | Wilkinson | 360/19.1 |
| 4,774,701 | 9/1988 | Ozaki et al. | 369/59 |
| 4,777,542 | 10/1988 | Ozaki | 360/48 |
| 4,805,046 | 2/1989 | Kuroki et al. | 360/49 |

Primary Examiner—Aristotelis Psitos
Assistant Examiner—Won Tae C. Kim
Attorney, Agent, or Firm—Dennis P. Monteith

[57] ABSTRACT

In formatting a digital data stream for interleaved recording with included resynchronization sequences inserted into the data stream, rather than recurrently recording the resynchronization sequences at the boundaries of the interleave blocks or recording many resynchronization sequences throughout the data, the present invention teaches staggered recording of the resynchronization sequences throughout the page of interleaved code words in a pseudo-random fashion. This staggering of the resynchronization sequences throughout the interleave blocks "randomizes" the errors due to tape drop outs so that errors are more uniformly distributed among the positions in the code words, and attendantly, are more likely to be correctable.

4 Claims, 5 Drawing Sheets

METHOD AND APPARATUS FOR DATA INTERLEAVE WITH PSEUDO-RANDOMIZED RESYNCHRONIZATION

BACKGROUND OF THE INVENTION

1. Field of the Invention

This invention relates to data interleaving in a magnetic tape recording system, and in particular to data interleaving having pseudo-randomly positioned resynchronization signals.

2. Description Relative to the Prior Art

Figure 1:
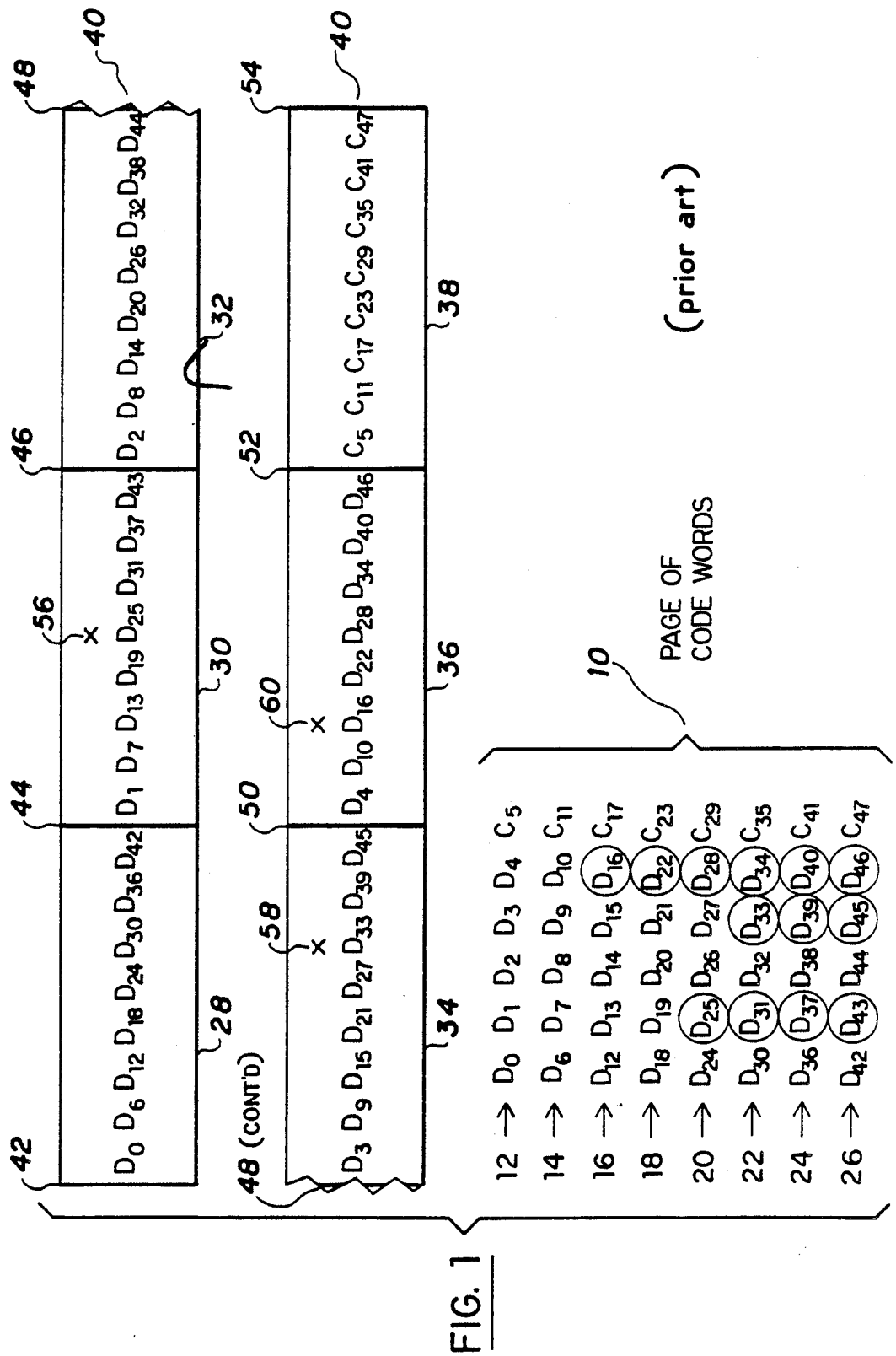
Figure 2:
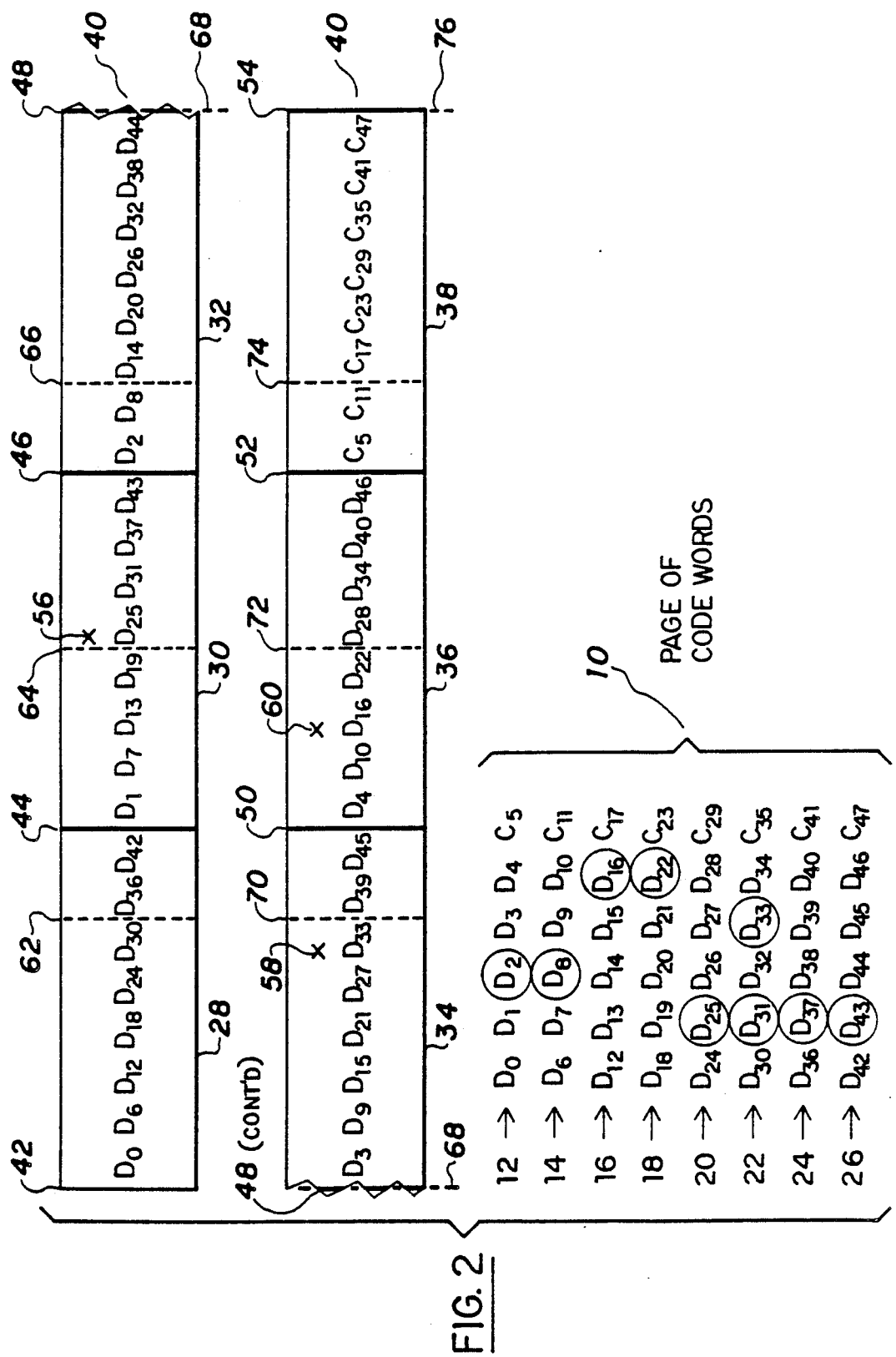
Figure 3:
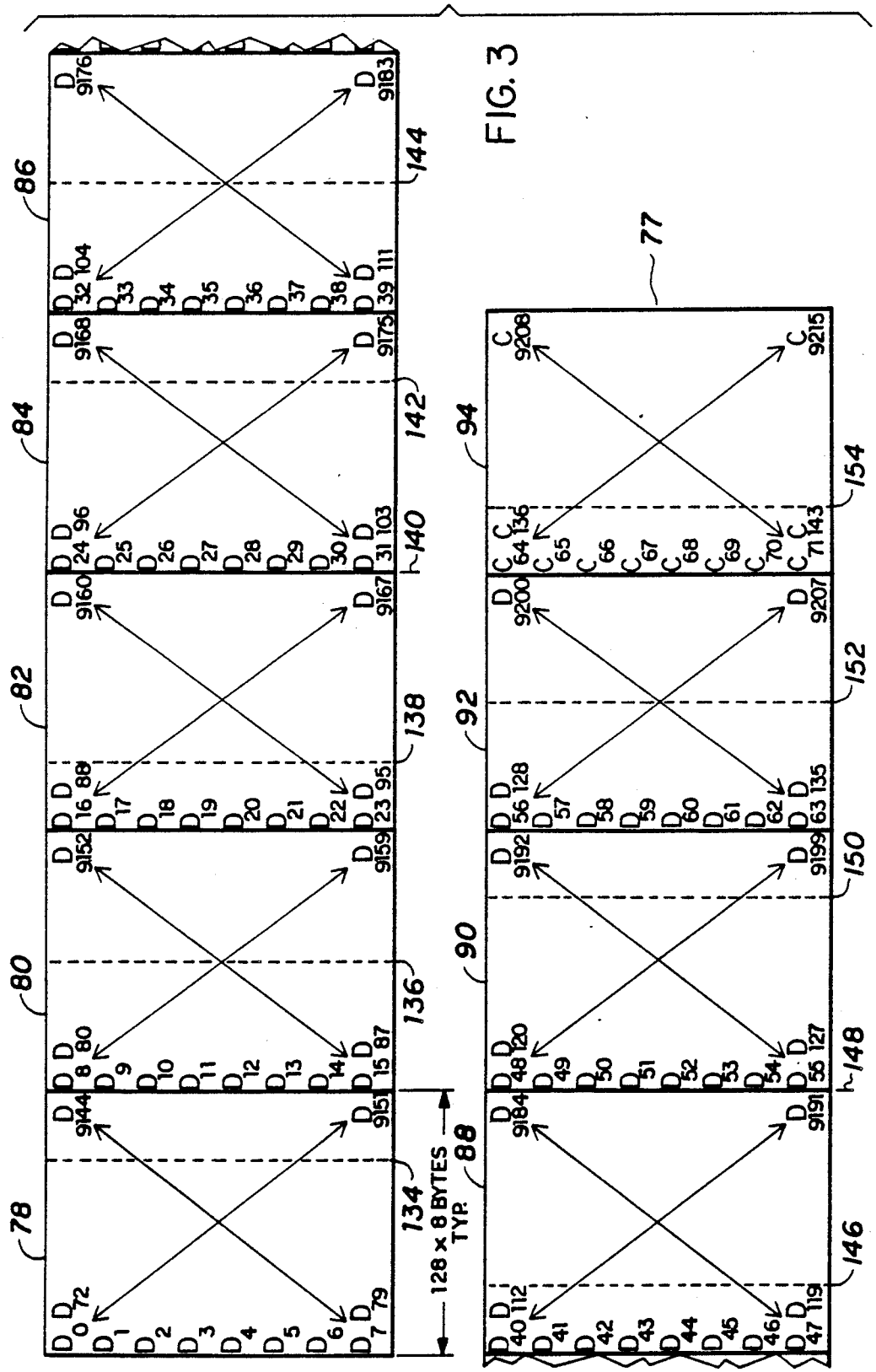
Figure 4:
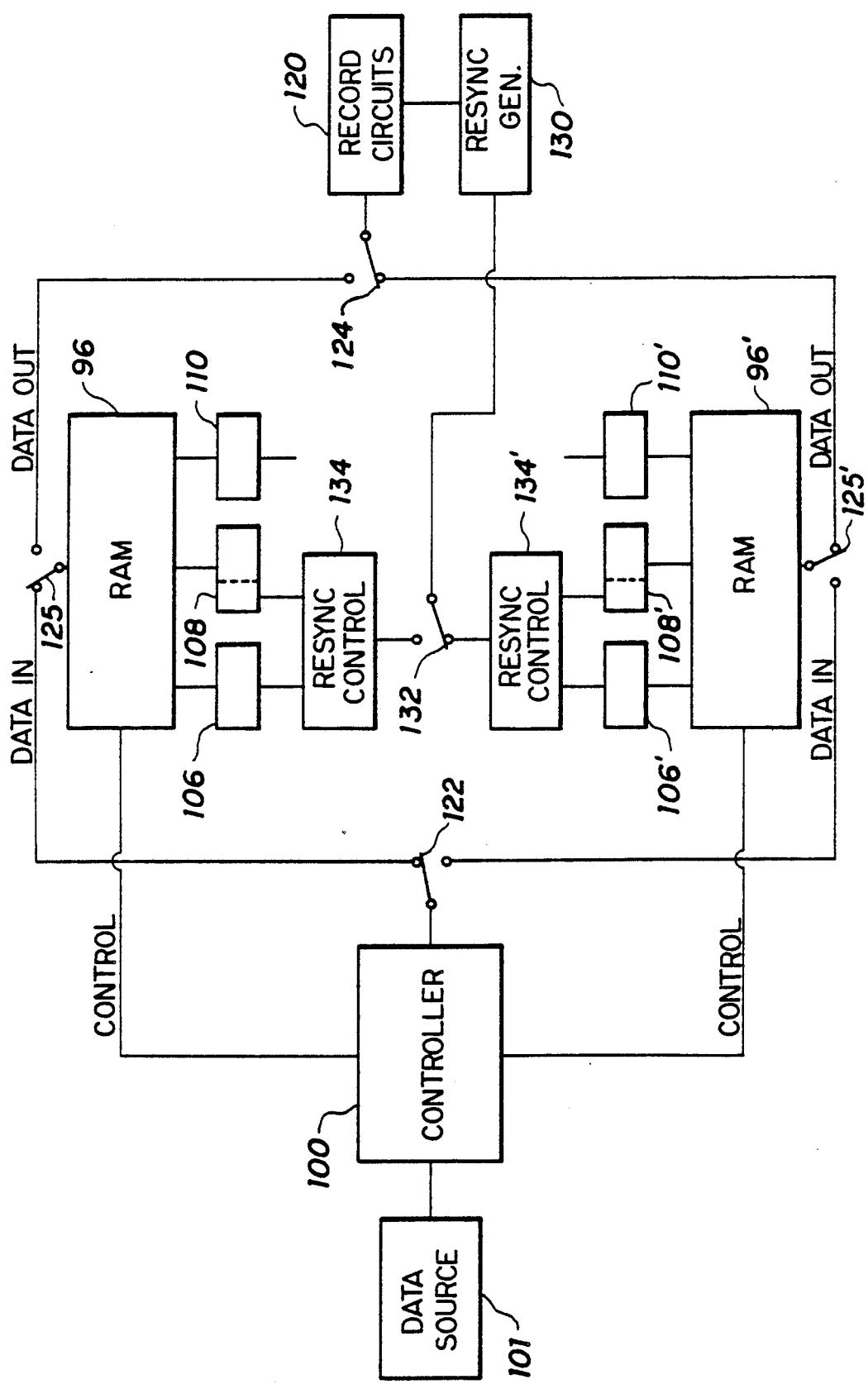
Figure 5:
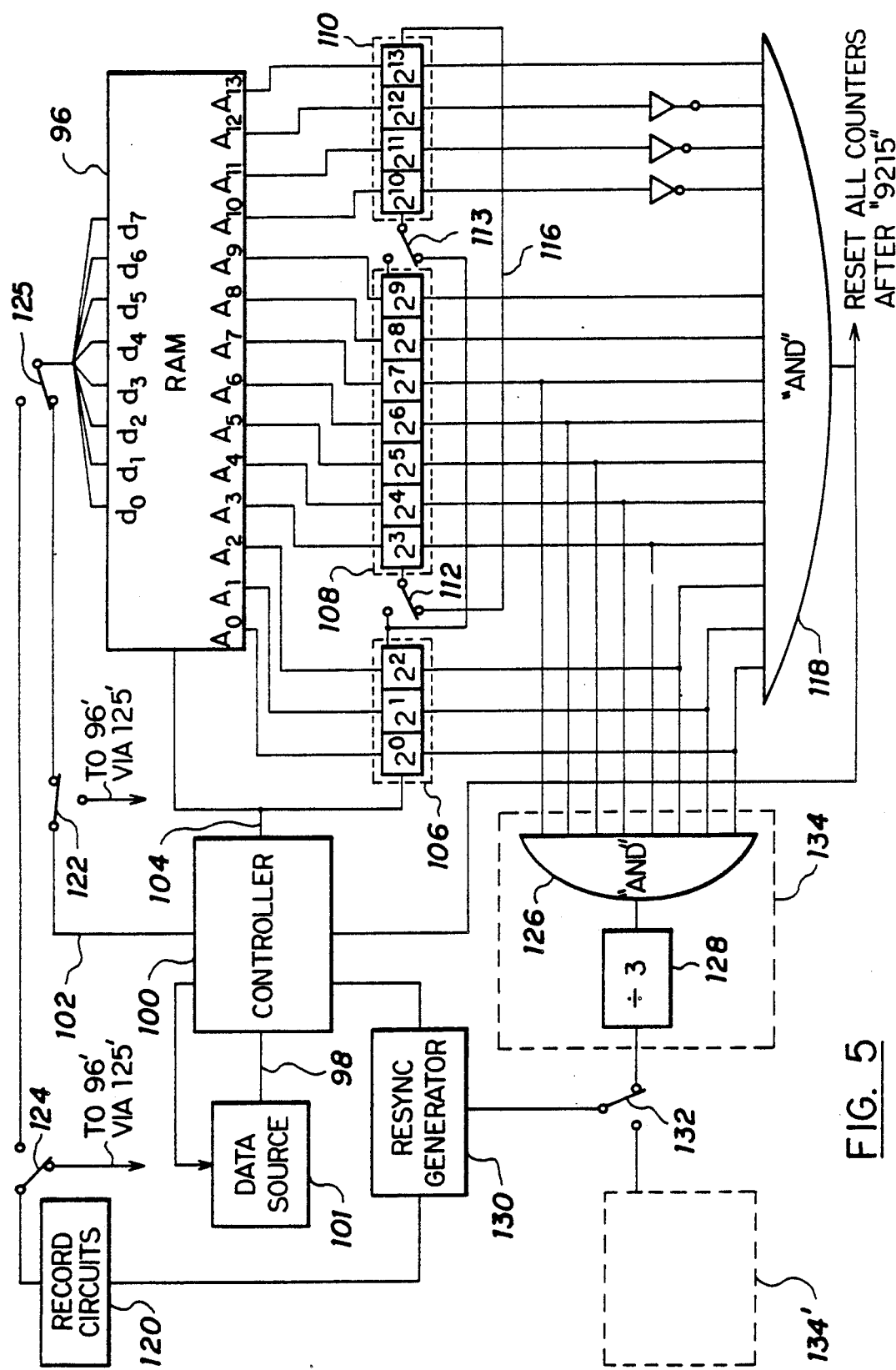

The invention, as well as the prior art, will be described with respect to the figures of which:

FIG. 1 is an illustration of interleaved code words recorded on a single track of a magnetic tape as practice-d in the prior art, FIG. 2 is an illustration of interleaved code words recorded on a single track of a magnetic tape having resynchronization sequences positioned in accordance with the present invention, FIG. 3 is an illustration of interleaved code words recorded on multitracks of a magnetic tape having resynchronization sequences positioned in accordance with the present invention, FIG. 4 is a block diagram of apparatus for data interleaving and for positioning of resynchronization sequences in a stream of digital data prior to recording, and FIG. 5 is a block diagram showing detail of a portion of the apparatus of FIG. 4.

It is known in the magnetic recording art that recovery of recorded signals may be enhanced by the use of error correction techniques coupled with data interleaving. To provide the error correction capability, sequentially occurring data bytes are divided into groups and appropriately computed check bytes are attached to each group to form a code word. Conventionally, the data bytes and check bytes are then sequentially recorded Magnetic media, however, is subject to dropouts where recording and or playback fails due to media defects, and some of the data is consequentially lost. An error correction routine is generally able to compensate for a dropout, provided that not too many sequential bytes have been missed Because a dropout may be several bytes in length, rearranging of the data for recording has been used in the prior art to alleviate the problem of the loss of sequential bytes due to a dropout. This data rearrangement is known as "interleaving" and is performed on a set of code words which may be designated as a "page". Rather than recording the page of code words byte by byte in sequence, the first byte of the first code word is recorded, then the first byte of the second code word is recorded, followed by the first byte of the third code word, and so on through the entire set of code words of the page. This entire assemblage of first bytes occupies an "interleave block", and the assembly and recording process is then repeated so that the first block is followed by similar interleave blocks containing the second bytes, third bytes . . . through the last bytes of the code words of the page. It will be appreciated that the length of the interleave blocks on the magnetic medium separates the sequential bytes of any given code word, and this distance is selected to be greater than the length of any anticipated dropout. A dropout may, therefore, affect one or more bytes in some given position of the code words, but it will not eradicate an entire code word, and may be compensated for by the error correction routine. Such an interleaving technique is described in "The Complete Handbook of Magnetic Recording", Finn Jorgensen, 3rd edition, Tab Books, Blue Ridge Summit, PA., pp. 569-571.

An important aspect of current data recording is the use of self clocking codes to provide timing information necessary for recovery of the recorded data on playback. The clocking information is stripped from these codes during playback, and is used to synchronize a phase locked loop whose synchronous output serves as the clock. Referring to FIG. 1, a page of code words, 10, comprises, for example, eight code words, 12 through 26. Each code word consists of five data bytes, and one check byte, for example, $D_0$, $D_1$, $D_2$, $D_3$, $D_4$, and $C_5$. The page 10 is also shown recorded on a single track of a magnetic tape 40 in interleaved fashion. The first bytes of each code word 12-26 are sequentially recorded in a first interleave block 28, the second bytes are recorded in the second interleave block 30 . . . and the last bytes, i.e. the check bytes, are recorded in interleave block 38. In the prior art, it has been the practice to record a resynchronizing signal at the natural break points of the data stream, that is, at the boundary of each interleave block 28-38, as seen, for example, in U.S. Pat. No. 3,916,440 in the name of John W. Irwin. On the occurrence of a dropout during playback, the phase lock loop will lose synchronization, and the reproduced bytes after the dropout will be lost until the phase lock loop is resynchronized by a resynchronization signal. For example, a dropout 56 will cause the loss of bytes $D_{25}$, $D_{31}$, $D_{37}$ and $D_{43}$, with resynchronization by the signal 46 which defines a boundary of the interleave block 30. Similarly, a dropout 58 will cause the loss of bytes $D_{33}$, $D_{39}$, and $D_{45}$, and a dropout 60 will cause the loss of bytes $D_{16}$, $D_{22}$, $D_{28}$, $D_{34}$, $D_{40}$ and $D_{46}$. It will be appreciated that the later occurring bytes in an interleave block are more susceptible to being lost due to a dropout than are the earlier occurring bytes, since the loss of phase lock synchronization wipes out not only the byte which causes the synchronization loss but all the bytes that follow it in the interleave block. This persistent tendency of the later occurring bytes to be lost on playback is extremely detrimental to the error correction capability of the system, and represents a problem arising from resynchronization as practiced in the prior art.

U.S. Pat. No. 4,774,701 issued to Ozaki et.al., teaches the use of many closely positioned resynchronization signals recorded repetitively with fixed, unchanging positions relative to the

SUMMARY OF THE INVENTION

Rather than recurrently recording the resynchronization signal at the boundaries of the interleave blocks or recording many resynchronization signals throughout the data, the present invention teaches staggered recording of the resynchronization signal throughout the page of interleaved code words in a pseudo-random fashion. This staggering of the resynchronization signals throughout the interleave blocks "randomizes" the errors with respect to the resynchronization signals, so that the errors are more uniformly distributed among the positions in the code words, and attendantly, are more likely to be correctable.

Referring to FIG. 2, the recording of FIG. 1 is shown with, the repositioned resynchronization signals, 62-76, distributed in accordance with the teachings of the invention. These signals are the boundaries of new blocks, designated as "physical blocks". The positioning of the resynchronization signals is such that the following relationship holds on a per page basis:

$$n \times B_1 = m \times B_2$$

where:
n = number of interleave blocks
$B_1$ = number of bytes in each interleave block
m = number of physical blocks bounded by resynchronization signals
$B_2$ = number of bytes in each physical block,
and where n, $B_1$, m, $B_2$ are all integers, and m > n and $B_1 > B_2$.

For example, in FIG. 2, the above relationship holds for:

$$n = 6, B_1 = 8$$
$$m = 8, B_2 = 6$$

Consideration of FIG. 2 shows that by following the teaching of the invention the errors caused by the dropouts 56-60, relative to the byte positions in the code words, are more evenly distributed throughout the page; that is, the later recorded bytes are not penalized relative to the earlier recorded ones. This may be seen by comparing the distribution of the circled bytes in the page 10 (i.e., those bytes which are in error due to the postulated drop outs) in FIG. 1 and FIG. 2. For example, referring to FIG. 2, it will be appreciated that the dropout 58 no longer causes the loss of bytes $D_{39}$, $D_{45}$ because the phase locked loop will be resynchronized by the signal 70. Similarly the dropout 60 causes the loss of $D_{16}$, $D_{22}$, but no longer results in loss of $D_{28}$, $D_{34}$, $D_{40}$, $D_{46}$ due to resynchronization signal 72. While there is a periodicity to boundaries of the physical blocks overlaying boundaries of the interleave blocks, viz, 68 overlays 48 and 76 overlays 54 in the Example of FIG. 2, the frequency of overlap may be controlled by choice of the number of blocks, m and n, and the bytes per block, $B_1$ and $B_2$.

DESCRIPTION OF THE INVENTION

In a preferred multitrack tape format, as shown in FIG. 3., rather than the single track format illustrated in FIG. 1, data and check bits are transversely recorded across 8 tracks of a magnetic tape 77. Each code word consists of 64 data bytes, and 8 check bytes for a total of 72 bytes per code word. Each code word is interleaved across 9 interleave blocks, 78-94, with 8 bytes from each code word recorded in each block. Interleave block 78 has the data bytes $D_0$–$D_7$ recorded in the first column across the tape, while interleave block 80 has the data bytes $D_8$–$D_{15}$ in its first column. Proceeding along the tape in this manner, it will be seen that the check bytes $C_{64}$–$C_{71}$ of the first code word, are located in the first column of interleave block 94. The bytes of the second code word then begin again in interleave block 78, where they occupy the second columns of the interleave blocks. The interleave distance between bytes of the same code word equals 128 transverse recorded columns across the tape, with the result that 1024 bytes are recorded per interleave block. Each 9 blocks contain a page of data, i.e. 1024×9=9216 bytes per page.

Referring to FIG. 4, the apparatus for formatting the above described page of data, and then for reading the formatted data out for recording on the tape, comprises two random access memories (RAM) 96, 96' each with a capacity to hold the 9216 bytes of a page. (In the drawings, different but related elements are identified with the same reference characters, albeit that corresponding elements in the various drawings are distinguished by the use of primes.) While one RAM 96 is writing in a page of data for formatting, the other RAM 96' is reading out the previously stored page of formatted data to the recording circuits, 120. This allows the tape to run continuously. Both the writing in operation and the reading out operation are essentially performed in synchronism, so that on the completion of a writing in/reading out cycle the roles of the RAMs 96, 96' may be interchanged, with data now being fed to the RAM which just finished having data read out, and data being read out from the RAM which has just finished having data written in. A controller 100 controls the changeover by switching of the input data from one RAM to the other by means of a switch 122, as well as the changeover of the recording circuits 120 from one RAM to the other by means of a switch 124. The controller 100 also controls the formatting of data as it flows into, and out of, the RAMs as will be described below. Data flow into and out of the RAMs 96, 96' is controlled by the positions of switches 125, 125'. RAM 96 has associated counters 106, 108 and 110, while RAM 96' has associated counters 106', 108, 110' which serve in formatting the data. A resynchronization generator 130 is connected to a Resynch Control unit 134, 134' by a switch 132 depending upon which RAM is reading out to the record circuits 120. All the switches illustrated in FIGS. 4 and 5 are shown positioned for writing in data to the RAM 96 and for reading out data from the RAM 96'. On the changeover of the roles of the RAMS 96, 96', the contact positions of all switches are transferred. Additional control circuits relating to control of the counters 106, 108, 110 and 106', 108', 110' are omitted from FIG. 4 for clarity, but are shown and described in detail in FIG. 5.

Referring to FIG. 5 and considering first the flow of a page of data into the RAM 96 (while RAM 96' is reading out). The data and check bytes are positionally stored in the RAM 96 in a manner to facilitate later reading out and writing on the tape in the interleaved format, and for inserting the resynchronization signals in accordance with the L teaching of the invention. The data inputs to the RAM 96 consist of 8 inputs, $d_0$–$d_7$, for accepting the 8 bits of a byte which stores at the address designated by the signal configuration simultaneously on the 14 address lines $A_0$–$A_{13}$.

Incoming data 98, feeds through the controller 100 which controls the flow 102 of the data bytes to the RAM 96. Each time a byte is transmitted to the RAM 96, the controller 100 emits a signal 104 to the RAM 96 which effects storage in the RAM 96 of the byte on the lines $d_0$–$d_7$ at the address appearing on the address lines $A_0$–$A_{13}$. The signal 104 is also fed to the low order stage $(2 \wedge)$ of a "fragmented" counter consisting of a three bit counter 106, a seven bit counter 108, and a four bit counter 110. Counters 106 and 108 are configured such that they roll over to all "zeros" on the count after their respective stages have been all "ones". Counter 110, however, is configured to roll over after its stages have reached the following values: $(2 \wedge 10) = 0$, $(2 \,\, 11)) = 0$, $(2 \wedge 12) = 0$ and $(2 \wedge 13) = 1$. The interconnections between the counters 106, 108, 110 depends upon the mode of operation in either storing data in the RAM 96, presently being described, or in reading the stored data from the RAM 96', as will be explained below. The order of the stages of the counters 106, 108, 110, are denoted as binarily running from 2∧0 to 2∧13, and the stage outputs are connected to the corresponding address lines A0–A13 of the RAM 96. In a straight binary counting sequence, the counter stages would feed each other sequentially, but during the storage mode of operation, as preparation for formatting the data on the tape, a switch 113 connects the output of the high order stage (2∧2) of the counter 106 to the input of the 2∧10 stage of the counter 110. Assume all counters have been reset to 0, and that bytes of data start to flow on the line 98 to the controller 100. The controller 100 feeds this data to the RAM 96, and the signal 104 effects the data storage and then steps the counter 106. The first eight bytes are stored in addresses 0–7 of the RAM 96, as the counter 106 advances one count for each byte, and consequently, the addresses generated in the counter 106 and fed to the RAM 96 step through the values 0–7. After the eighth byte is stored the counter 106 recycles to 0 and also feeds a pulse to the input of the 2∧10 stage of counter 110 through the switch 113 setting the address lines to 1024, i.e. 2∧10 stage equal to "1", all other stage outputs equal to "0". The next data byte, $D_8$, feeding under control of the controller 100 is therefore stored at the address 1024 in the RAM 96, and the count via the counter 106 progresses as another eight bytes are stored, before the counter 106 output advances the counter 110 another step of 1024 counts. The sequence of counting and addresses to the RAM 96 are therefore, 0, 1, 2, 3, 4, 5, 6, 7, 1024, 1025, 1026, 1027, 1028, 1029, 1030, 1031, 2048, 2049, . . . It will be appreciated that this formatting of the data in the RAM 96, corresponds to the locations for the recording of the data on the tape 77 as shown in FIG. 3; eight bytes in sequence corresponding to the arrangement of bytes transverse to the tape, and then a jump of 1024 to pick up the beginning of the next interleave block, with a repeat of this pattern through all 9216 bytes of the page. It has been stated that the page comprises 9 interleave blocks. While the ninth block is being addressed, the counter 110 stages have the following values, (2 10)=0, (2 11)=0, (2 12)=0, (2 13) TM 1. The next time the counter 106 cycles, its output signal causes counter 110 to roll over to all "zeros", which advances the count of the 2 3 stage via the signal output on line 116. Under these conditions the counter 106 is at 0 the counter 110 has been reset to zero and the counter 108 has a "1" in the 2 3 stage. The address fed to the RAM 96 for the next byte to be stored, D72, therefore has the value "8". As additional bytes are fed under control of the controller 100, the addresses advance through the sequence, 8, 9, 10, 11, 12, 13, 14, 15, followed by a jump corresponding to 128 columns of the tape, i.e. an increase in address values of 1024, as previously described. The next sequence of addresses is 1032, 1033, 1034, 1035, 1036, 1037, 1038, 1039, i.e. the addresses which will be translated to the second column in the second interleave block of the tape 77. This process is repeated until a total of 9216 bytes are stored in the RAM. After the address "9215" is detected in the "And" circuit 118, all the counters are reset and the controller cuts off the flow of data to the RAM 96, which is now full.

The controller 100 now sequences the changeover so that RAM 96 is read out and the RAM 96' is written into, as previously mentioned (FIG. 4). This sequencing includes reconfiguring the counters 106, 108 and 110 for transferring the data from the RAM 96 to the recording circuits to provide the format of FIG. 3. Firstly, as previously mentioned, all the switches transfer. The transfer of the switch 112 sets up the counter 108 to be driven by the 2 2 stage of the counter 106, while the switch 113 transfers the output of the 2 9 stage of the counter 108 to drive the 2 10 stage of the counter 110. Switches 124 and 125 transfer the data lines, which now will output the data stored in the RAM 96 to the record circuits 120. (It will be appreciated that the switches of FIGS. 4 and 5, while illustrated as mechanical contacts for clarity in exposition, are implemented as digital electronic switching circuits in a manner known to those skilled in the art.)

During the reading out cycle, the controller 100 pulses the input stage of the counter 106 again generating binarily sequenced addresses via the address lines $A_0$–$A_{13}$. As before, the counter 106 steps from 0–7 causing the reading out of these addresses from the RAM 96. Because the switch 112 is now transferred from that shown in FIG. 5, on the next pulse from the controller, the 2 3 stage of the counter 108 changes and the address 8 is fed to the RAM 96. Recalling that the byte $D_{72}$ is stored at address 8, as previously described, the next bytes to read out to the recording circuits 120 are $D_{72}$, $D_{73}$, $D_{74}$, $D_{75}$, $D_{76}$, $D_{77}$, $D_{78}$, $D_{79}$ which occupy the second column on the tape 77 as shown in FIG. 3. It will be appreciated that on sequential readout of the previously stored data bytes from the RAM 96, the resulting recorded data on the tape 77 will be in the format of FIG. 3.

The present invention teaches insertion of pseudo-random resynchronizing signals into the recorded data. Recalling the relationship for the positioning of the resynchronizing signals;

$$n \times B_1 = m \times B_2$$

where
n = number of interleave blocks
$B_1$ = number of bytes in each interleave block
m = number of physical blocks bounded by resynchronization signals
$B_2$ = number of bytes in each physical block
and where n, $B_1$, m, $B_2$ are all integers, and m > n and B , and n, $B_1$, m, $B_2$ are considered on a per page basis.

For the embodiment under consideration, the above parameters have been selected as follows: n=9, $B_1$=1024, m=12, $B_2$=768, and using the above relationship provides 9×1024=12×768=9216 bytes per page. The 1024 bytes per interleave block are partitioned into 8 byte groups for recording across the tape, resulting in 1024/8=128 columns of data per interleave block. Similarly, the physical blocks are partitioned into a 8 byte groups, resulting in 768/8=96 columns of data per physical block. As previously described, the boundaries of the physical blocks are the resynchronization signals (For example, FIG. 2, reference numbers 62, 64, 66, 68 . . . 76). Therefore, after the recording of every 8×96=768 bytes a resynchronization sequence is inserted and recorded on all tracks of the magnetic tape. Referring to FIG. 5, a coincidence is generated from the 2∧0, 2∧1, 2∧2, 2∧3, 2∧4, 2∧5, 2∧6, 2∧7 stage outputs of the counters 106 and 108 in the "And" circuit, 126, which therefore outputs a signal for every 256 pulses fed to the counter 106 input from the controller 100. The output of the "And" circuit 126 drives a "divide by 3" counter 128 whose output is connected through contacts of the switch 132 to a resynchronization generator 130. The counter 128 emits a pulse for every third pulse it receives from the "And" circuit 126 i.e. for every $3 \times 8 \times 32 = 768$ pulses emitted by the controller 100. The switch 132 transfers the resynchronization generator 130 to the resynchronization control (134 or 134') depending upon which RAM (96 or 96') is reading out to the record circuits. The resynchronization generator 130 is enabled by the pulse from the counter 128 after each $8 \times 96 = 768$ bytes are recorded, and the generator 130 signals the controller 100 to hold up the flow of data from the data source. The resynchronization generator 130 then outputs a resynchronization sequence to all channels of the record circuits. The controller 100 then allows the flow of data from the data source 101 to continue. Referring to FIG. 3, it will be appreciated that the resynchronization signals 134, 136, 138, 140, ..... 154 are thereby recordable on the tape 77 in a pseudo-random fashion relative to the interleave block boundaries. It will be noted that the resynchronization signals 134-154 are inserted in addition to the recorded data bytes; the flow of data being momentarily interrupted to accommodate the recording of the resynchronization signals.

The invention has been described in detail with particular reference to preferred embodiments thereof, but it will be understood that variations and modifications can be effected within the spirit and scope of the invention.

What is claimed is:

1. Apparatus for pseudo-randomly positioning resynchronization signals with respect to individual bytes of multi-byte code words initially arranged in a predetermined sequence, said apparatus comprising:
   (a) means, responsive to the predetermined sequence of multi-byte code words, for temporarily storing the code words in a rearranged pattern the essence of which is the interleaving of individual bytes of different code words according to their respective positions in the initial sequence;
   (b) means, coupled to said storing means, for reading out the interleaved bytes in contiguous blocks comprising a predetermined number $B_1$ of interleaved code word bytes; and
   (c) means, responsive to said reading out means, for periodically injecting one resynchronization signal into the interleaved bytes for every $B_2$ bytes read out where $B_1 > B_2$, wherein at least one resynchronization signal is positioned at a variable location within each block of $B_1$ interleaved bytes read out, the effect of which is that each resynchronization signal is pseudo-randomly positioned to resynchronize an adjacent railing cluster of $B_2$ individual bytes regardless of their respective positions within their own block of interleaved bytes and regardless of their respective positioned with the initital predetermined sequence.

2. Apparatus as defined in claim 1 wherein said means for temporarily storing the code words in a rearranged pattern comprises first and second random access memory devices.

3. Apparatus as defined in claim 2 wherein said first random access memory writes in a first sequence of interleaved byes while said second random access memory contemporaneously reads out a second sequence of interleaved bytes.

4. A method for pseudo-randomly positioning resynchronization signals with respect to individual bytes of multi-byte code words initially arranged in a predetermined sequence, said method comprising:
   (a) temporarily storing the multi-byte code words in a pattern corresponding to the interleaving of individual bytes of different code words according to their respective positions in the initial sequence;
   (b) reading out the interleaved bytes in contiguous blocks each of which comprises a predetermined number $B_1$ of interleaved code words bytes; and
   (c) periodically injecting one resynchronization signal into the interleaved bytes for every $B_2$ bytes read out where $B_1 > B_2$ so that at least one synchronization signal is positioned at a variable location within each block of $B_1$ interleaved bytes read out, the effect of which is to stagger the position of resynchronization signals within respective blocks of $B_1$ interleaved bytes to resynchronization an adjacent trailing cluster of $B_2$ individual bytes regardless of their respective positions within their own block of interleaved bytes.

* * * * *